United States Patent [19]
Loboda et al.

[11] Patent Number: 6,159,871
[45] Date of Patent: Dec. 12, 2000

[54] METHOD FOR PRODUCING HYDROGENATED SILICON OXYCARBIDE FILMS HAVING LOW DIELECTRIC CONSTANT

[75] Inventors: Mark Jon Loboda, Midland; Jeffrey Alan Seifferly, Bay City, both of Mich.

[73] Assignee: Dow Corning Corporation, Midland, Mich.

[21] Appl. No.: 09/086,811

[22] Filed: May 29, 1998

[51] Int. Cl.$^7$ .......................... H01L 21/31; H01L 21/469
[52] U.S. Cl. .......................... 438/786; 438/778; 438/758
[58] Field of Search .................................. 438/931, 769, 438/778, 780, 786, 758

[56] References Cited

U.S. PATENT DOCUMENTS

| | | | |
|---|---|---|---|
| 4,842,888 | 6/1989 | Haluska et al. | 427/38 |
| 4,981,724 | 1/1991 | Hochberg et al. | 427/255.3 |
| 5,156,881 | 10/1992 | Okano et al. | 427/572 |
| 5,182,000 | 1/1993 | Antonelli et al. | 204/181.1 |
| 5,208,069 | 5/1993 | Clark et al. | 427/226 |
| 5,284,730 | 2/1994 | Takei et al. | 430/66 |
| 5,364,666 | 11/1994 | Williams et al. | 427/579 |
| 5,465,680 | 11/1995 | Loboda | 117/84 |
| 5,525,550 | 6/1996 | Kato | 437/238 |
| 5,530,581 | 6/1996 | Cogan | 359/265 |
| 5,599,740 | 2/1997 | Jang et al. | 437/190 |
| 5,800,877 | 9/1998 | Maeda et al. | 427/535 |
| 5,874,367 | 2/1999 | Dobson | 438/787 |

FOREIGN PATENT DOCUMENTS

| | | | |
|---|---|---|---|
| 0289402 | 11/1988 | European Pat. Off. | C09D 1/00 |
| 0 469 926 A1 | 2/1992 | European Pat. Off. | C08J 7/06 |
| 0 533 129 A2 | 3/1993 | European Pat. Off. | C23C 16/40 |
| 0 589 678 A2 | 3/1994 | European Pat. Off. | H01L 23/02 |
| 0 771 886 A1 | 5/1997 | European Pat. Off. | C23C 16/36 |
| 0 774 533 A1 | 5/1997 | European Pat. Off. | C23C 16/40 |
| 0774533 | 5/1997 | European Pat. Off. | C23C 16/40 |
| 0 926 724 A2 | 12/1998 | European Pat. Off. | H01L 21/306 |
| 0 926 715 A2 | 6/1999 | European Pat. Off. | H01L 21/3105 |
| 0 935 283 A2 | 8/1999 | European Pat. Off. | H01L 21/312 |
| 4404690 | 8/1995 | Germany | C23C 16/22 |
| 19084375 | 1/1999 | Germany . | |
| 199 04 311 A1 | 1/1999 | Germany | C23C 16/44 |
| 84222659 | 10/1984 | Japan . | |
| 8-279505 | 10/1996 | Japan . | |
| 9064029 | 3/1997 | Japan . | |
| 9251997 | 9/1997 | Japan . | |
| 9260369 | 10/1997 | Japan . | |
| 10242143 | 9/1998 | Japan . | |
| 11251293 | 9/1999 | Japan . | |
| WO 9955526 | 11/1999 | Japan . | |
| 2 015 983 | 9/1979 | United Kingdom | C03C 17/22 |
| 2316535 | 2/1998 | United Kingdom | H01L 21/31 |
| WO 99/38202 | 7/1999 | WIPO | H01L 21/312 |
| WO 99/41423 | 8/1999 | WIPO . | |

OTHER PUBLICATIONS

A comparative study of sub–micron gap filling and planarization techniques; A. Hass Bar–Ilan, N. Gutmann; SPIE; vol. 2636; pp. 277–288.

Reactivity of Alkylsilanes and Alkylcarbosilanes in Atomic Hydrogen–Induced Chemical Vapor Deposition; A. M. Wrobel, A. Walkiewicz–Pietrzykowska, and M. Stasiak; J. Electrochem. Soc.; vol. 145, No. 3; Mar. 1998; pp. 1060–1065.

Materials Research Society Symposium Proceedings vol. 447; Safe Precursor Gas For Broad Replacement of SiH4 in Plasma Processes Employed in Integrated Circuit Production; M. J. Loboda, J. A. Seifferly, C. M. Grove, and R. F. Schneider; 1997 Materials Research Society; pp. 145–151.

Journal of Applied Polymer Science, vol. 66, Plasma Polymerization of Trimethylsilane in Cascade Arc Discharge; Y. S. Lin, H. K. Yasuda; pp. 1653–1665.

J. Vac. Sci. Technol. A 12(1), Jan./Feb. 1994; Plasma–enhanced Chemical vapor deposition of a SiC:H films from organosilicon precursors; M. J. Loboda, J. A. Seifferly, and F. C. Dall; pp. 90–96.

Handbook of Chemical Vapor Deposition (CVD): principles, technology, and applications; Hugh O. Pierson; 1992; pp. 208–209.

Journal of the Ceramic Society of Japan 101; 1993; Thermal Stability of SiNxCy Films Prepared by Plasma CVD; M. Moriyama, T. Ichino, N. Hayashi, and K. Kamata; pp. 757–763.

Journal De Physique IV; Colloque C3, supplement au Journal de Physique II, vol. 3, 1993; SiCN coatings prepared by PACVD from TMS–NH3–Ar system on steel; M. Ducarroir, W. Zhang and R. Berjoan; pp. 247–253.

Deposition Technologies for Films and Coatings, Developments and Applications; Bunshah et al.; Noyes Publications; 1982; pp. 339–367.

1998 Dumic Conference; Low Dielectric Constant Oxide Films Deposited Using CVD Techniques; S. McClatchie, K. Beekmann, A. Kiermasz; pp. 311–318.

The Electrochemical Society, Inc.; Proceedings of the Symposium on Silicon Nitride and Silicon Dioxide Thin Insulating Films; Proceedings vol. 97–10; Using Trimethylsilane To Improve Safety, Throughput and Versatility In PECVD Processes; Loboda et al.; pp. 443–453.

Applied Surface Science 46 (1990); Filling of Si oxide into a deep trench using digital CVD method; Y. Horiike, T. Ichihara and H. Sakaue; pp. 168–174.

Liquid Phase Oxidation Employing O Atoms Produced by Microwave Discharge and Si(CH3)4; S. Noguchi, H. Okano, and Y. Horiike; Extended Abstracts of the 19th Conference on Solid State Devices and Materials, Tokyo, 1987, pp. 451–454.

(List continued on next page.)

*Primary Examiner*—Richard Elms
*Assistant Examiner*—Bradley K Smith
*Attorney, Agent, or Firm*—Sharon K. Severance

[57] ABSTRACT

This invention pertains to a method for producing hydrogenated silicon oxycarbide (H:SiOC) films having low dielectric constant. The method comprises reacting an methyl-containing silane in a controlled oxygen environment using plasma enhanced or ozone assisted chemical vapor deposition to produce the films. The resulting films are useful in the formation of semiconductor devices and have a dielectric constant of 3.6 or less.

20 Claims, No Drawings

OTHER PUBLICATIONS

Nara, A. et al.: "Low Dielectric Constant Insulator Formed by Downstream Plasma CVD at Room Temperature Using TMS/02", 1996, International Conference on Solid State Devices and Materials (SSDM '96), Yokohama, Japan, Aug. 26–29, 1996, vol. 36, No. 3Bm pp. 1477–1480.

Loboda, M. et al.: "Deposition of Low–K Dielectric Films Using Trimethylsilane", Proceedings of the Symposia on Electrochemical Processing In ULSI Fabrication I and Interconnect and Contact Metallization: Materials, Processes, and Reliability, Proceedings of the Symposia on Electrochemical Processing In ULSI Fabrication I and INT, pp. 145–152, 1999.

METHOD FOR PRODUCING HYDROGENATED SILICON OXYCARBIDE FILMS HAVING LOW DIELECTRIC CONSTANT

FIELD OF THE INVENTION

This invention pertains to a method for producing hydrogenated silicon oxycarbide (H:SiOC) films having low dielectric constant. The method comprises reacting a methyl-containing silane in a controlled oxygen environment using plasma enhanced or ozone assisted chemical vapor deposition to produce the films. The resulting films are useful in the formation of semiconductor devices.

BACKGROUND OF THE INVENTION

The use of chemical vapor deposition (CVD) to produce $SiO_2$, SiNC or SiC thin films on semiconductor devices from silicon-containing materials is well known in the art. Chemical vapor deposition processes typically comprise introducing the gaseous silicon-containing material and a reactive gas into a reaction chamber containing the semiconductor substrate. An energy source such as thermal or plasma induces the reaction between the silicon-containing material and reactive gas thereby resulting in the deposition of the thin film of $SiO_2$, SiNC or SiC on the semiconductor device. Plasma enhanced chemical vapor deposition (PECVD) is typically carried out at low temperatures (<500° C.) thereby making PECVD a suitable means for producing dielectric and passivation films on semiconductor devices. Silicon-containing materials include silane ($SiH_4$), tetraethyl orthosilicate (TEOS), silacyclobutanes, and alkylsilanes such as trimethylsilane.

The use of methyl-containing silanes to produce silicon dioxide ($SiO_2$), amorphous SiNC and silicon carbide (SiC) films by chemical vapor deposition is known in the art. For example, U.S. Pat. No. 5,465,680 to Loboda discloses a method for making crystalline SiC films. The method comprises heating the substrate 600° C. to 1000° C. and thereafter exposing the substrate to trimethylsilane in a standard chemical vapor deposition process. EP Patent Application No. 0 774 533 to Loboda discloses a method of making $SiO_2$ coatings from the CVD of a reactive gas mixture comprising an organosilicon material and an oxygen source. EP Patent Application No. 0771 886 to Loboda discloses a method of making SiNC coating from the CVD of a reactive gas mixture comprising an organosilicon material and a nitrogen source.

As semiconductor device structures become increasingly smaller the dielectric constant as well as the integrity of the film become important. Films produced by known CVD processes have high dielectric constants (i.e. 3.8 or greater). Therefore there is a need for processes and materials that result in low dielectric constant films. A new deposition processes known as Low-k Flowfill®, produces films having a dielectric constant of <3.0. This method uses a chemical vapor deposition reaction between methylsilane and hydrogen peroxide to produce a methyl doped silicon oxide film (See S. McClatchie, K. Beekmann, A. Kiermasz; *Low Dielectric Constant Oxide Films Deposited Using CYD Techniques,* 1988 DUMIC Conference Proceedings, 2/98, p. 311–318). However, this process requires a non standard CVD system, the use of a lower stability oxygen source (hydrogen peroxide) and generates water as a by-product which can be undesirable in semiconductor devices.

It is therefore an object of this invention to provide a method for producing low dielectric constant thin films of hydrogenated silicon oxycarbide by chemical vapor deposition.

SUMMARY OF THE INVENTION

This invention pertains to a method of producing thin films of hydrogenated silicon oxycarbide (H:SiOC) having low dielectric constants on substrates, preferably semiconductor devices. The method comprises the plasma enhanced or ozone enhanced chemical vapor deposition of a reaction mixture comprising an methyl-containing silane and an oxygen providing gas. By controlling the amount of oxygen available during the reaction/deposition process a film comprising hydrogen, silicon, carbon and oxygen is produced. These films typically have a dielectric constant of 3.6 or less and are particularly suited as interlayer dielectrics.

DETAILED DESCRIPTION OF THE INVENTION

This invention pertains to a method for producing hydrogenated silicon oxycarbide films on substrate, preferably semiconductor substrates. The method for producing the films comprises the chemical vapor deposition reaction of a reactive gas mixture comprising an alkysilane and an oxygen providing gas wherein the amount of oxygen present during the reaction is controlled. By "semiconductor substrate" it is meant it is meant to include silicon based devices and gallium arsenide based devices intended for use in the manufacture of a semiconductor components including focal plane arrays, opto-electronic devices, photovoltaic cells, optical devices, transistor-like devices, 3-D devices, silicon-on-insulator devices, super lattice devices and the like. Semiconductor substrates include integrated circuits preferably in the wafer stage having one or more layers of wiring or integrated circuits before the application of any metal wiring.

The hydrogenated silicon oxycarbide films produced herein may be represented by the general formula $Si_wO_xC_yH_z$ where w has a value of 10 to 33, preferably 18 to 20 atomic %, x has a value of I to 66, preferably 18 to 21 atomic percent, y has a value of 1 to 66, preferably 3 1 to 38 atomic % and z has a value of 0.1 to 60, preferably 25 to 32 atomic %; and w+x+y+z=100 atomic %.

The hydrogenated silicon oxycarbide films are produced from a reactive gas mixture comprising an methyl-containing silane and an oxygen providing gas. Methyl-containing silanes useful herein include methylsilane ($CH_3SiH_3$), dimethylsilane (($CH_3)_2SiH_2$), trimethylsilane (($CH_3)_3SiH$) and tetramethylsilane (($CH_3)_4Si$), preferably trimethylsilane.

A controlled amount of oxygen is present in the deposition chamber. The oxygen may be controlled by the type of oxygen providing gas used, or by the amount of oxygen providing gas that is used. If too much oxygen is present in the deposition chamber a silicon oxide film with a stoichiometry close to $SiO_2$ will be produced and the dielectric constant will be higher than desired. Oxygen providing gases include, but are not limited to air, ozone, oxygen, nitrous oxide and nitric oxide, preferably nitrous oxide. The amount of oxygen providing gas is typically less than 5 volume parts oxygen providing gas per volume part of methyl-containing silane, more preferably from 0.1 to 4.5 volume parts of oxygen providing gas per volume part of methyl-containing silane. One skilled in the art will be able to readily determine the amount of oxygen providing gas based on the type of oxygen providing gas and the deposition conditions.

Other materials may be present in the reactive gas mixture. For example, carrier gases such as helium or argon, dopants such as phosphine or diborane, halogens such as fluorine or any other material that provides additional desirable properties to the film may be present.

The reactive gas mixture is introduced into a deposition chamber containing a substrate, preferably an semiconductor substrate, wherein the reaction between the methyl-containing silane and oxygen providing gas is induced resulting in the deposition of a film on the substrate wherein the film comprises hydrogen, silicon, carbon and oxygen and has a dielectric constant of 3.6 or less on the substrate. Any chemical vapor deposition (CVD) method which has a substrate temperature of less than 500° C. may be used herein. Temperatures greater than 500° C. are typically not suitable for semiconductor substrates, in particular semiconductor substrates having aluminum wiring. Plasma enhanced chemical vapor deposition (PECVD) is preferred due to the low temperatures that can be used and wide use in the industry. Ozone enhanced CVD may be also be used herein.

In PECVD the gas mixture is reacted by passing it through a plasma field. The plasmas used in such processes comprise energy derived from a variety of sources such as electric discharges, electromagnetic fields in the radio-frequency or microwave range, lasers or particle beams. Generally preferred in the plasma deposition processes is the use of radio frequency (10 kHz to $10^2$ MHz) or microwave (1.0 to 10 GHz) energy at moderate power densities (0.1 to 5 watts/cm$^2$). The specific frequency, power and pressure, however are generally tailored to the equipment. Preferably the films are produced using PECVD at a power of 20 to 1000 W; a pressure of 1 to 10,000 mTorr; and a temperature of 25 to 500° C. Confined, low pressure (1–5 mTorr) microwave frequency plasmas, often referred to as high density plasmas, can be combined with a RF frequency excitation in a process which helps planarize a varying surface topography during CVD growth. This process is useful in the formation of interlayer dielectrics.

The films produced herein may be of varying thicknesses. Films having thicknesses of 0.01 to 10 μm may be produced by the method of this invention. Preferably the films have a thickness of 0.5 to 3.0 μm.

One advantage to the instant method is that when nitrous oxide is used as the oxygen providing gas, the film composition and properties remain essentially the same even when the amount of nitrous oxide in the reactive gas mixture is significantly varied (1.2:1 to 4.5:1 volume parts N$_2$O to methyl-containing silane)

Another advantage to the method of this invention is the ability to link successive growth processes to produce multilayer structures for example of SiO$_2$/H:SiOC/SiO$_2$ or SiC:H/H:SiOC/SiC:H by increasing or deleting the oxygen providing gas at the appropriate time during the CVD process. It is preferred to produce discreet layers by stopping the reactive gas flow, adjusting the amount of oxygen providing gas and thereafter resuming the reactive gas flow to produce the next layer.

The films produced herein, due to the low dielectric constant, are particularly suited as interlayer dielectrics in semiconductor integrated circuit manufacturing including, but not limited to, gate dielectrics, premetal and intermetal dielectrics and passivation coatings. The films produced herein have a dielectric constant of 3.6 or less, preferably, 3.2 or less, more preferably 3.0 or less.

EXAMPLES

So that those skilled in the art can understand and appreciate the invention taught herein, the following examples are presented, it being understood that these examples should not be used to limit the scope of this invention found in the claims.

In Examples 1–9 and Comparative Examples 1–2, dielectric properties were measured using metal-insulator-semiconductor (Examples 4–9) and metal-insulator-metal capacitors (Examples 1–3, Comparative Examples 1–2). Measurements were performed immediately after the metal gate deposition (top electrode) and again after one or more anneal cycles in N$_2$ in the temperature range of 350 to 400° C. Relative permittivity, K, was calculated from the capacitor geometry and the film thickness.

EXAMPLES 1–9

A reactive gas mixture comprising trimethylsilane (3MS) and nitrous oxide (See Tables 1 and 2 for gas flow amounts) was introduced into a capacitively coupled parallel plate PECVD system using thermally oxidized (0.1 μm SiO$_2$) silicon wafers coated with 0.5 μm Al or bare silicon wafers as the substrates. The PECVD system was operated at a power of 350 W, pressure of 2700 mTorr and temperature of 250° C. Helium was used as a carrier gas. The dielectric constant, growth rate and film stress (compressive) results for Examples 1–9 are in Tables 1 and 2. The composition and density of the films produced in Examples 4–9 are in Table 3. As can be seen in Table 2, even when the amount of nitrous oxide is significantly varied, the resulting films have essentially the same composition and properties.

TABLE 1

| Example No. | 3MS (sccm) | He (sccm) | N$_2$O (sccm) | K (MIM) | K (400° C. post metal anneal) | Growth Rate (Å/min) | Stress* (MPa) |
|---|---|---|---|---|---|---|---|
| 1 | 100 | 380 | 120 | 3.6 | 3.6 | 535 | 61 C |
| 2 | 100 | 260 | 240 | 3.4 | 3.1 to 3.4 | 1531 | 28 C |
| 3 | 100 | 140 | 360 | 3.2 | 2.8–3.0 | 3615 | 53 C |

*C = compressive stress

TABLE 2

| Example No. | 3MS (sccm) | He (sccm) | N$_2$O (sccm) | K (MIS) | K (post metal anneal*) | Growth Rate (Å/min) |
|---|---|---|---|---|---|---|
| 4 | 100 | 380 | 120 | 3.2 | 3.1 | 624 |
| 5 | 100 | 260 | 240 | 3.1 | 3.0 | 2076 |
| 6 | 100 | 140 | 360 | 3.1 | 3.1 | 4830 |
| 7 | 100 | 100 | 400 | 3.0 | 2.9 | 5510 |
| 8 | 100 | 50 | 450 | 3.1 | 3.0 | 6076 |

*three cycles, one hour soak each, 200-350-200° C., 200-400-200° C., 200-400-200° C.

TABLE 3

| Example No. | Thickness (μm) | Si atom % | H atom % | C atom % | O atom % | Density g/cc |
|---|---|---|---|---|---|---|
| 4 | 0.62 | 0.20 | 0.25 | 0.37 | 0.18 | 1.46 |
| 5 | 0.83 | 0.18 | 0.29 | 0.35 | 0.18 | 1.34 |
| 6 | 0.97 | 0.2 | 0.3 | 0.31 | 0.19 | 1.36 |
| 7 | 1.10 | 0.18 | 0.29 | 0.33 | 0.20 | 1.36 |
| 8 | 1.22 | 0.18 | 0.27 | 0.34 | 0.21 | 1.36 |

COMPARATIVE EXAMPLES 1–2

Using the same procedure for Examples 1–8, a reactive gas mixture comprising trimethylsilane and oxygen were used in the plasma enhanced chemical vapor deposition. Results are given in Table 4. The resulting films were essentially SiO$_2$ films due to too high of an amount of oxygen used in the reactive gas mixture.

TABLE 4

| Example No. | 3MS (sccm) | He (sccm) | O$_2$ (sccm) | K (MIM) | K (400° C. post metal anneal) | Growth Rate (Å/min) | Stress* (MPa) |
|---|---|---|---|---|---|---|---|
| C1 | 100 | 440 | 60 | 4.6 | — | 1456 | 60 T |
| C2 | 100 | 380 | 120 | 5.8 | — | 2481 | 71 T |

*T = tensile stress

COMPARATIVE EXAMPLE 3

This example is Example 3 of EP Patent Application No. 0 774 533 A1. A reactive gas mixture comprising 6 sccm of trimethylsilane (TMS) and 523 sccm of nitrous oxide was introduced into a capacitively coupled parallel plate PECVD system using silicon wafers as the substrates. The PECVD system was operated at a power of 50 W, a pressure of 1000 mTorr and a temperature of 300° C. Helium (500 sccm) was used as a carrier gas. Due to the high amount of nitrous oxide (N$_2$O) being used, the resulting film was a SiO$_2$ film.

What is claimed is:

1. A chemical vapor deposition method for producing hydrogenated silicon oxycarbide films comprising
   introducing a reactive gas mixture comprising a methyl-containing silane and an oxygen providing gas into a deposition chamber containing a substrate and inducing a reaction between the methyl-containing silane and oxygen providing gas at a temperature of 25° C. to 500° C.;
   wherein there is a controlled amount of oxygen present during the reaction to provide a film comprising hydrogen, silicon, carbon and oxygen having a dielectric constant of 3.6 or less on the substrate.
2. The method as claimed in claim 1 wherein the methyl-containing silane is selected from the group consisting of methylsilane, dimethylsilane, trimethylsilane and tetramethylsilane.
3. The method as claimed in claim 1 wherein the methyl-containing silane is trimethylsilane.
4. The method as claimed in claim 1 wherein the oxygen providing gas is selected from the group consisting of air, ozone, oxygen, nitrous oxide and nitric oxide.
5. The method as claimed in claim 1 wherein the oxygen providing gas is nitrous oxide.
6. The method as claimed in claim 1 wherein the methyl-containing silane is trimethylsilane and the oxygen providing gas is nitrous oxide.
7. The method as claimed in claim 1 wherein the amount of oxygen providing gas is less than 5 volume parts oxygen providing gas per volume part of methyl-containing silane.
8. The method as claimed in claim 1 wherein the amount of oxygen providing gas is 0.1 to 4.5 volume parts of oxygen providing gas per volume part of methyl-containing silane.
9. The method as claimed in claim 1 wherein the reaction is induced by exposing the reactive gas mixture to plasma.
10. The method as claimed in claim 9 wherein the reaction is induced by exposing the reactive gas mixture to plasma at a power of 20 to 1000 W, a pressure of 1 to 10,000 mTorr, and a temperature of 25 to 500° C.
11. The method as claimed in claim 1 wherein the film has a dielectric constant of 3.2 or less.
12. The method as claimed in claim 1 wherein the film has a dielectric constant of 3.0 or less.

13. The method as claimed in claim 1 wherein the hydrogenated silicon oxycarbide film is represented by the formula $Si_wO_xC_yH_z$ where w has a value of 18 to 20 atomic %, x has a value of 18 to 21 atomic percent, y has a value of 31 to 38 atomic % and z has a value of 25 to 32 atomic %; and w+x+y+z=100 atomic %.

14. The method as claimed in claim 1 wherein the reactive gas mixture additionally comprises a carrier gas.

15. The method as claimed in claim 1 wherein the hydrogenated silicon oxycarbide film has a thickness of 0.01 to 10 µm.

16. The method as claimed in claim 1 wherein the hydrogenated silicon oxycarbide film has a thickness of 0.5 to 3.0 µm.

17. The method as claimed in claim 1 wherein the substrate is a semiconductor substrate.

18. The method as claimed in claim 1 wherein the amount of oxygen providing gas is increased or decreased during the reaction between the methyl-containing silane and the oxygen providing gas to produce a film containing successive layers selected from the group consisting of $SiO_2$, H:SiOC and SiC:H.

19. The method as claimed in claim 1 wherein the reaction is induced by exposing the reactive gas mixture to confined, low pressure microwave frequency plasma combined with RF frequency excitation.

20. The film produced by the method as claimed in claim 1 having general formula $Si_wO_xC_yH_z$ where w has a value of 18 to 20 atomic %, x has a value of 18 to 21 atomic percent, y has a value of 31 to 38 atomic % and z has a value of 25 to 32 atomic %; and w+x+y+z=100 atomic % and having a thickness of 0.01 to 10 µm.

* * * * *